United States Patent
Ota et al.

(10) Patent No.: US 11,467,186 B2
(45) Date of Patent: Oct. 11, 2022

(54) INSPECTION JIG, INSPECTION DEVICE, AND CONTACT TERMINAL

(71) Applicant: NIDEC-READ CORPORATION, Kyoto (JP)

(72) Inventors: Norihiro Ota, Kyoto (JP); Sukkwi Kim, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 0 days.

(21) Appl. No.: 17/043,733

(22) PCT Filed: Aug. 8, 2019

(86) PCT No.: PCT/JP2019/031439
§ 371 (c)(1),
(2) Date: Sep. 30, 2020

(87) PCT Pub. No.: WO2020/039969
PCT Pub. Date: Feb. 27, 2020

(65) Prior Publication Data
US 2021/0364553 A1    Nov. 25, 2021

(30) Foreign Application Priority Data
Aug. 23, 2018  (JP) .............................. JP2018-156097

(51) Int. Cl.
*G01R 1/073* (2006.01)
*G01R 1/067* (2006.01)

(52) U.S. Cl.
CPC ..... *G01R 1/07371* (2013.01); *G01R 1/06722* (2013.01)

(58) Field of Classification Search
CPC ..................... G01R 1/07371; G01R 1/06722
See application file for complete search history.

(56) References Cited

U.S. PATENT DOCUMENTS

| | | |
|---|---|---|
| 9,583,857 B2 | 2/2017 | Nasu et al. |
| 10,649,004 B2 | 5/2020 | Ota |
| 10,649,005 B2 | 5/2020 | Ota |
| 10,656,179 B2 | 5/2020 | Ota |

(Continued)

FOREIGN PATENT DOCUMENTS

| | | | | |
|---|---|---|---|---|
| JP | 2017078660 A | * | 4/2017 | ......... G01R 1/07314 |
| WO | 2018181273 A1 | | 10/2018 | |
| WO | 2019039233 A1 | | 2/2019 | |

*Primary Examiner* — Paresh Patel
(74) *Attorney, Agent, or Firm* — Viering, Jentschura & Partner MBB

(57) ABSTRACT

When a load necessary for inspection is applied to a cylindrical body in the axial direction thereof, an end of the first bar-like main body is located closer to the other end side of the cylindrical body than one end of a support portion in a support member that supports the body portion, an end of the second bar-like main body is located closer to one end side of the cylindrical body than the other end of the support portion, the body portion is located in the entire portion where the support portion is located, and a radial distance between the outer peripheral surface of the axial central portion of at least one of the first spring portion and the second spring portion and the support member is larger than the distance between the body portion and the support portion.

21 Claims, 9 Drawing Sheets

(56) References Cited

U.S. PATENT DOCUMENTS

2015/0276807 A1* 10/2015 Chen .................. G01R 1/06722
324/755.05
2016/0118738 A1* 4/2016 Nasu .................. G01R 1/07314
439/700

* cited by examiner

INSPECTION JIG, INSPECTION DEVICE, AND CONTACT TERMINAL

CROSS-REFERENCE TO RELATED APPLICATIONS

This is the U.S. national stage of application No. PCT/JP2019/031439, filed on Aug. 8, 2019, and priority under 35 U.S.C. § 119(a) and 35 U.S.C. § 365(b) is claimed from Japanese Patent Application No. 2018-156097, filed on Aug. 23, 2018; the disclosures of which are incorporated herein by reference.

FIELD

Various embodiments relate to an inspection jig used for inspecting an inspection object, an inspection device provided with the inspection jig, and a contact terminal used for the inspection jig.

BACKGROUND

Conventionally, an inspection jig for an inspection device has been known in which a cylindrical central conductor (bar-like member) is inserted into a cylindrical body (cylindrical member) where a spring portion is formed in the middle of the axial direction. In this inspection jig, a contact terminal is used in which the central conductor is fixed to the cylindrical body in the vicinity of an end of the cylindrical body through, for example, welding or crimping, with an end portion of the central conductor protruding from the end of the cylindrical body. In the contact terminal, when one of the cylindrical body and the central conductor is in contact with the electrode, and the other one is in contact with the inspection object, the one is biased to the electrode according to an elastic restoring force of the spring portion, and the other one is biased to the inspection object, so that the contact state in the electrode and the inspection object is stabilized.

In the inspection jig described above, when a current is applied to the contact terminal to conduct energization inspection, Joule heat may be generated in the gap of the central conductor in the cylindrical body, and the cylindrical body may become a high temperature. Then, when the generated heat is transferred to the spring portion, a decrease in elastic coefficient and thermal deformation occur in the spring portion, which causes a decrease in inspection accuracy in the inspection device.

SUMMARY

An inspection jig according to an example of the present disclosure includes a contact terminal, and a support member that supports the contact terminal. The contact terminal includes a cylindrical body formed of a conductive material in a cylindrical shape, and a first central conductor and a second central conductor formed of a conductive material in a bar shape. The first central conductor includes a first bar-like main body that is inserted into one end of the cylindrical body. The second central conductor includes a second bar-like main body that is inserted into another end of the cylindrical body. The cylindrical body includes a spring portion formed of a spiral body that is configured by providing a spiral groove along a peripheral surface of the cylindrical body, and a body portion where the spiral groove is not provided. A first spring portion is formed in one end side of the cylindrical body, a second spring portion is formed on the other side, and the body portion is formed between the first spring portion and the second spring portion. An outer peripheral surface of the body portion is supported by a support portion in the support member. When a load necessary for inspection is applied to the cylindrical body in an axial direction, an insertion-side end of the first bar-like main body and an insertion-side end of the second bar-like main body are located on an inner peripheral side of the body portion, the insertion-side end of the first bar-like main body is located closer to the other end side of the cylindrical body than one end of the support portion in the support member that supports the body portion, the insertion-side end of the second bar-like main body is located closer to one end side of the cylindrical body than the other end of the support portion, and the body portion is located in an entire portion where the support portion is located. A radial distance between an outer peripheral surface of an axial central portion of at least one of the first spring portion and the second spring portion and the support member is larger than a distance between the body portion and the support portion.

The above and other elements, features, steps, characteristics and advantages of the present disclosure will become more apparent from the following detailed description of the preferred embodiments with reference to the attached drawings.

DETAILED DESCRIPTION

Figure 1:
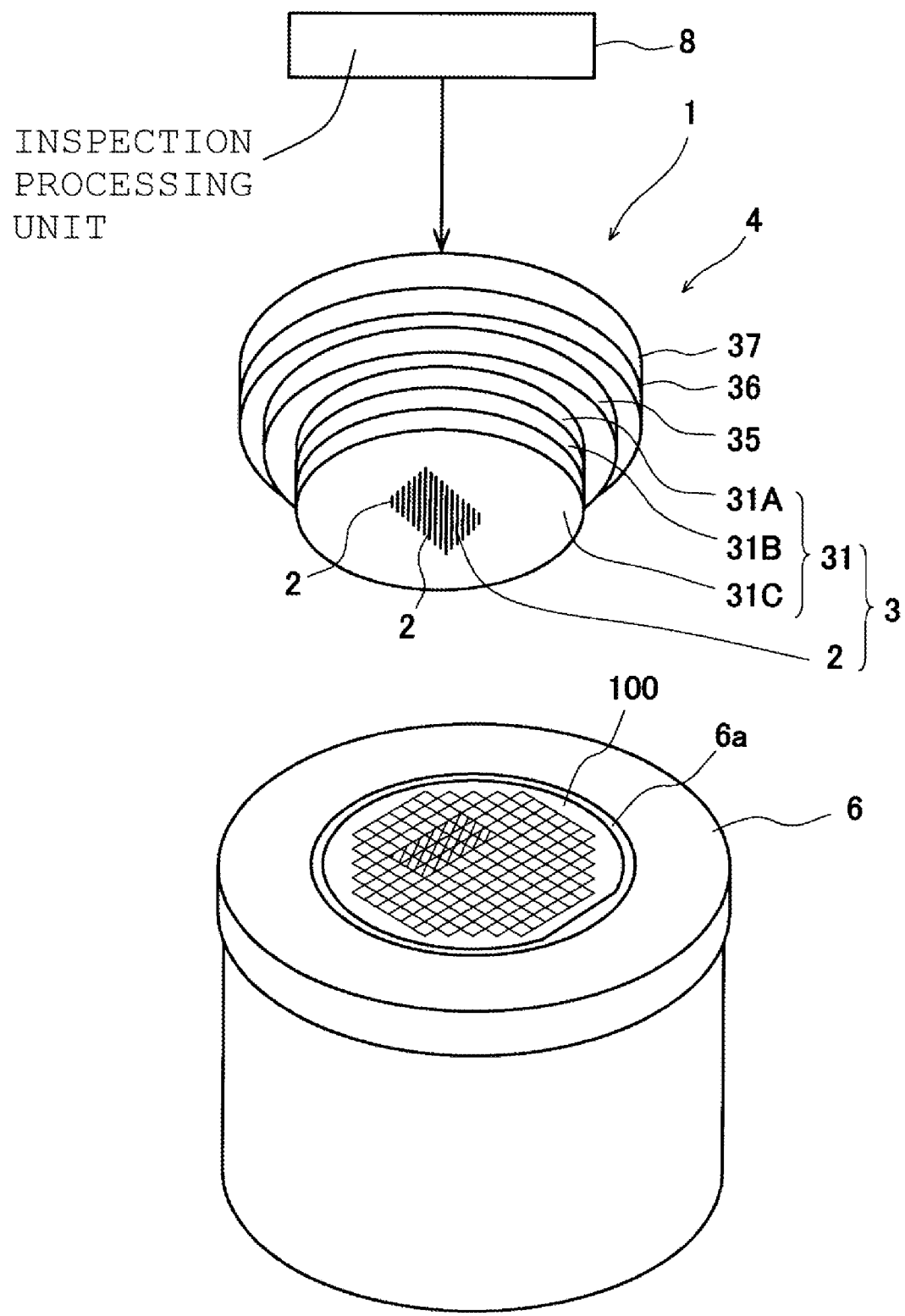
FIG. 1 is a conceptual diagram schematically illustrating a configuration of a semiconductor inspection device provided with an inspection jig according to a first embodiment of the present disclosure.

Hereinafter, a semiconductor inspection device 1 including an inspection jig 3 according to a first embodiment will be described with reference to FIGS. 1 to 5. Note that components with the same reference numerals in the respective drawings will be the same components and description thereof will be omitted. Further, for convenience of description, even if the drawings have the same configuration, the characteristic ratios of the characteristic portions, length, width, and length ratios, thickness, width, and length ratios may be different between the drawings.

FIG. 1 is a conceptual diagram schematically illustrating a configuration of the semiconductor inspection device 1 including the inspection jig 3. The semiconductor inspection device 1 corresponds to an example of the inspection device. The semiconductor inspection device 1 illustrated in FIG. 1 is an inspection device for inspecting a circuit that is formed on a semiconductor wafer 100 that is an example of an inspection object in this embodiment.

In the semiconductor wafer 100, circuits corresponding to a plurality of semiconductor chips are formed, for example, on a semiconductor substrate made of silicon or the like. Note that the semiconductor inspection device 1 may apply to an electronic component such as a semiconductor chip, a chip size package (CSP), a semiconductor element (integrated circuit (IC)), and the like as an inspection object on which electrical inspection is performed.

Further, the inspection device according to the present disclosure is not limited to the semiconductor inspection device 1 according to this embodiment, and may be, for example, a substrate inspection device that inspects a substrate. The substrate that is an inspection object may be, for example, a substrate such as a printed wiring substrate, a glass epoxy substrate, a flexible substrate, a ceramic multi-layered wiring substrate, a package substrate for a semiconductor package, an interposer substrate, or a film carrier, an electrode panel for a display such as a liquid crystal display, an electro-luminescence (EL) display, or a touch panel display, an electrode panel for a touch panel, or substrates of various kinds.

The semiconductor inspection device 1 illustrated in FIG. 1 includes an inspection portion 4, a sample platform 6, and an inspection processing unit 8. A placement portion 6a on which the semiconductor wafer 100 is mounted is provided on the upper surface of the sample platform 6. The semiconductor wafer 100 is fixed at a predetermined position by the sample platform 6 and the placement portion 6a.

The placement portion 6a is configured to be able to be lifted and lowered and is adapted such that the semiconductor wafer 100 accommodated in the sample platform 6 is caused to be lifted to an inspection position and the semiconductor wafer 100 after the inspection is stored in the sample platform 6, for example. Also, the placement portion 6a is adapted to be able to cause the semiconductor wafer 100 to rotate and orient an orientation flat to a predetermined direction, for example. Also, the semiconductor inspection device 1 includes a transport mechanism such as a robot arm, which is not illustrated in the drawing. By the transport mechanism, the semiconductor wafer 100 is placed on the placement portion 6a, and the inspected semiconductor wafer 100 is transported from the placement portion 6a.

The inspection portion 4 includes an inspection jig 3, a first pitch conversion block 35, a second pitch conversion block 36, and a connection plate 37. The inspection jig 3 is a jig for performing inspection by bringing probes 2, 2, . . . , which are a plurality of contact terminals, into contact with the semiconductor wafer 100. For example, the inspection jig 3 is configured by a so-called probe card.

A plurality of chips is formed in the semiconductor wafer 100. A plurality of pads and inspection points such as bumps are formed in each of the chips. Corresponding to a partial region of the plurality of chips formed in the semiconductor wafer 100 (for example, the hatched region in FIG. 1; hereinafter, referred to as "inspection region"), the inspection jig 3 supports a plurality of probes 2 such that the probes 2 correspond to the respective inspection points in the inspection region. The semiconductor inspection device 1 brings the probe 2 into contact with each inspection point in the inspection region, and applies current to the semiconductor wafer 100 via the probe 2 to perform energization inspection.

If the inspection in the inspection region in the semiconductor wafer 100 is finished, the placement portion 6a lowers the semiconductor wafer 100, the sample platform 6 moves in parallel and causes the inspection region to move, the placement portion 6a causes the semiconductor wafer 100 to be lifted, and inspection is then performed by causing the probes 2 to contact with a new inspection region. In this manner, the entire semiconductor wafer 100 is inspected by performing the inspection while causing the inspection region to sequentially move.

In addition, FIG. 1 is an explanatory diagram schematically and conceptually illustrating an example of the configuration of the semiconductor inspection device 1 from the viewpoint of allowing easy understanding of the disclosure, and the number, the density, and the arrangement of the probes 2, the shapes, and the ratio between the sizes of the inspection portion 4 and the sample platform 6, and the like are also illustrated in a simple and conceptual manner. For example, the inspection region is illustrated in an enlarged and emphasized manner as compared with a typical semiconductor inspection device in terms of easy understanding of the arrangement of the probes 2, and the inspection region may be smaller or larger. Further, in this embodiment, the probe 2 extends downward in the inspection jig 3, but the extension direction of the probe 2 is not limited to downward.

The connection plate 37 is configured such that the second pitch conversion block 36 can be detached therefrom and attached thereto. A plurality of electrodes that are connected to the second pitch conversion block 36 (not illustrated) is formed on the connection plate 37. The respective electrodes of the connection plate 37 are electrically connected to the inspection processing unit 8 with cables, a connection terminals, or the like (not illustrated), for example. The first pitch conversion block 35 and the second pitch conversion block 36 are pitch conversion members for converting intervals between the probes 2 into an electrode pitch on the connection plate 37. The first pitch conversion block 35 and the second pitch conversion block 36 can be configured using multilayered wiring substrates of, for example, multi-layer organic (MLO), multi-layer ceramic (MLC), or the like.

The inspection jig 3 includes a plurality of probes 2, 2, . . . , and so on having a tip end 2A and a base end 2B, which will be described later, and a support member 31 for holding a plurality of probes 2, 2, . . . , and so on with the tip end 2A facing the semiconductor wafer 100. The inspection jig 3 can be attached/detached to/from the first pitch conversion block 35 according to the type of the semiconductor wafer 100 to be inspected.

Figure 2:
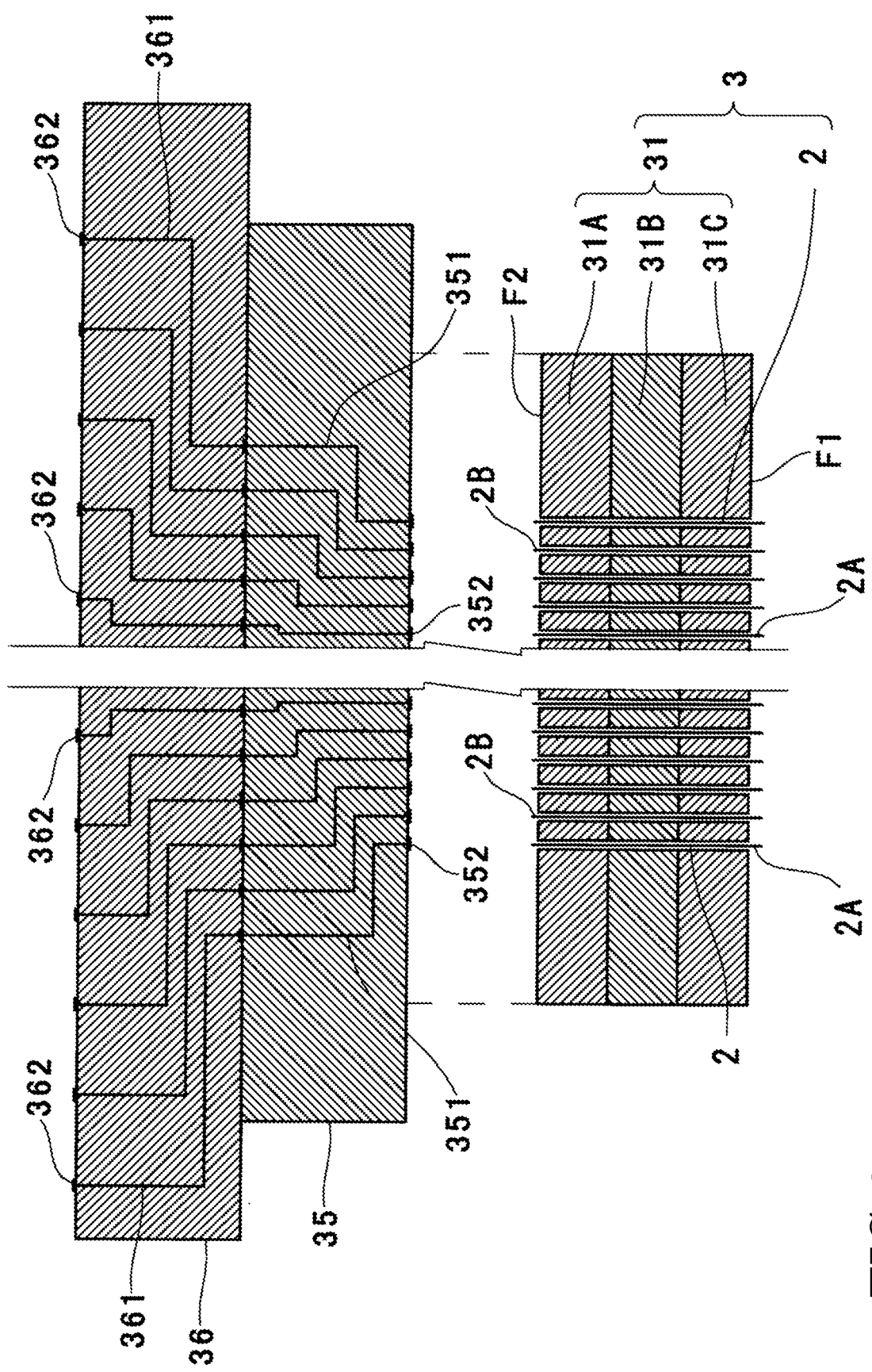
FIG. 2 is a cross-sectional view illustrating the inspection jig, a first pitch conversion block, and a second pitch conversion block illustrated in FIG. 1.

The first pitch conversion block 35 is provided with an electrode 352 that is in contact with the base end 2B of each probe 2 and is conductive (see FIG. 2). The inspection portion 4 includes a connection circuit that electrically connects the respective probes 2 of the inspection jig 3 to the inspection processing unit 8 via the connection plate 37, the second pitch conversion block 36 and the first pitch conversion block 35 and switches the connection, which is not illustrated in the drawing.

In this manner, the inspection processing unit 8 is adapted to be able to supply an inspection signal to an arbitrary probe 2 and detects a signal from an arbitrary probe 2 via the connection plate 37, the second pitch conversion block 36 and the first pitch conversion block 35. Details of the first pitch conversion block 35 and the second pitch conversion block 36 will be described later.

Figure 3:
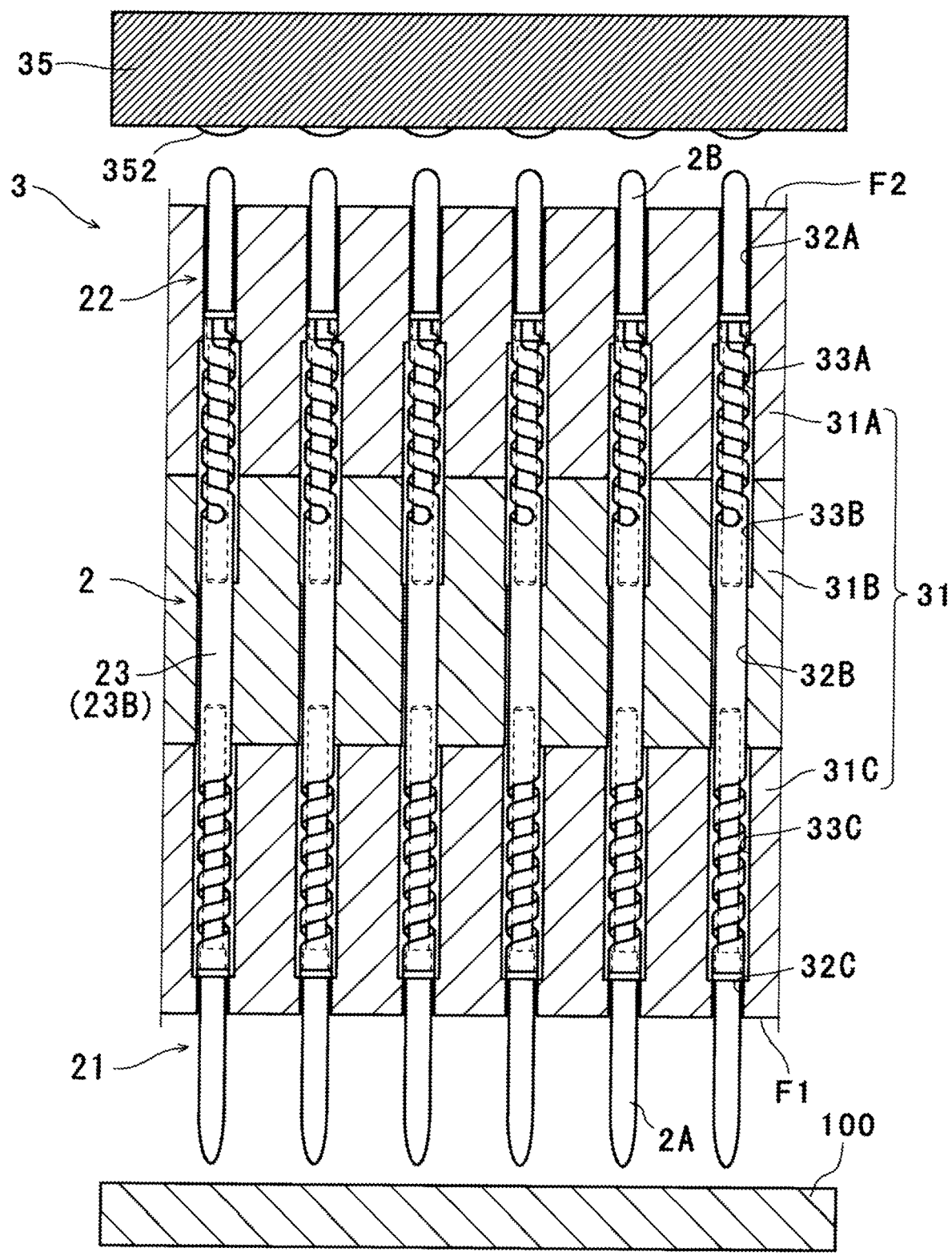
FIG. 3 is a cross-sectional view schematically illustrating an example of a configuration of the inspection jig illustrated in FIGS. 1 and 2.

As illustrated in FIGS. 2 and 3, the probe 2 as a whole has a substantially bar shape. The support member 31 is configured by an electrode-side support body 31A, an intermediate support body 31B, and an inspection-side support body 31C which are each formed in a disk shape having the same diameter. Hereinafter, the electrode-side support body 31A, the intermediate support body 31B, and the inspection-side support body 31C are simply referred to as "support bodies 31A to 31C". The support bodies 31A to 31C are provided by being sequentially stacked from the first pitch conversion block 35 side. That is, the inspection-side support body 31C is disposed so as to face the semiconductor wafer 100. As a material of the support bodies 31A to 31C, a ceramic material containing boron nitride or silicon nitride as a main component, which has a relatively high thermal conductivity compared with other materials, is adopted.

As illustrated in FIGS. 2 and 3, a plurality of through-holes that support the probe 2 are formed in the support bodies 31A to 31C. The respective through holes are disposed to correspond to the positions of the inspection points set on a wiring pattern of the semiconductor wafer 100 that is an inspection object. As a result, the tip end 2A of the probe 2 contacts the inspection point of the semiconductor wafer 100. For example, the plurality of probes 2 may be arranged at the respective intersection points at which a plurality of first straight lines that are parallel to each other and a plurality of second straight lines that are parallel to each other intersect in a grid pattern. The inspection points are, for example, electrodes, wiring patterns, solider bumps, connection terminals, or the like.

FIG. 2 is a cross-sectional view of the inspection jig 3 illustrated in FIG. 1, the first pitch conversion block 35, and the second pitch conversion block 36. FIG. 2 illustrates the inspection jig 3 and the first pitch conversion block 35 in a separated state. The inspection-side support body 31C of the support member 31 has a facing surface F1 arranged to face the semiconductor wafer 100. The tip end 2A of the probe 2 projects from the facing surface F1. The electrode-side support body 31A in the support member 31 has a rear surface F2 that is in close contact with the lower surface of the first pitch conversion block 35. A base end 2B of the probe 2 slightly projects from the rear surface F2.

Each of the first pitch conversion block 35 and the second pitch conversion block 36 has a substantially cylindrical shape that is flattened in the axial direction, for example. A plurality of electrodes 352 is formed in the lower surface of the first pitch conversion block 35 that is brought into close contact with the rear surface F2 such that the electrodes 352 correspond to the arrangement of the base end 2B of each probe 2. A plurality of electrodes arranged at a wider interval than the plurality of electrodes 352 is formed on the upper surface of the first pitch conversion block 35. The electrodes 352 on the lower surface and the electrodes on the upper surface of the first pitch conversion block 35 are connected to each other with wires 351.

A plurality of electrodes is formed in the lower surface of the second pitch conversion block 36 such that the electrodes correspond to the arrangement of the electrodes on the upper surface of the first pitch conversion block 35. A plurality of electrodes 362 formed corresponding to the arrangement of the electrode on the aforementioned connection plate 37 is formed on the upper surface of the second pitch conversion block 36. The electrodes on the lower surface and the electrodes 362 on the upper surface of the second pitch conversion block 36 are connected to each other with wires 361.

In this manner, the inspection processing unit 8 can input and output a signal to and from each probe 2 by assembling the inspection jig 3, the first pitch conversion block 35, and the second pitch conversion block 36 and attaching the second pitch conversion block 36 to the connection plate 37.

As illustrated in FIG. 3, the support bodies 31A to 31C are provided with insertion hole portions 33A to 33C, respectively, each having an opening hole having a predetermined diameter. Further, the support bodies 31A to 31C are provided with opening holes formed coaxially with the insertion hole portions 33A to 33C and formed of support portions 32A to 32C having a smaller diameter than the insertion hole portions 33A to 33C, respectively. The inner diameter of the support portion 32C is smaller than the outer diameter of a flange portion 21E.

Then, in the support bodies 31A to 31C, the support portions 32A to 32C and the insertion hole portions 33A to 33C are communicated with each other, thereby forming a through hole into which the probe 2 is inserted. The support member 31 is not limited to the example in which the plate-shaped support bodies 31A to 31C are stacked, and for example, one member may be provided with a through hole including one or a plurality of support portions and an insertion hole portion.

The inspection jig 3 is configured by inserting the probe 2 into the through holes (support portions 32A to 32C and insertion hole portions 33A to 33C) formed in the support bodies 31A to 31C. At this time, the support portions 32A to 32C are in contact with the outer peripheral surface of the probe 2, so that the probe 2 is supported by the support member 31.

Specifically, the support portion 32A formed on the electrode-side support body 31A supports the upper side of the probe 2 (specifically, the upper end portion of a cylindrical body 23 described later). Further, a support portion 32B formed on the intermediate support body 31B supports a body portion 23B of the probe 2. Further, the support portion 32C formed on the inspection-side support body 31C supports the lower side of the probe 2 (specifically, the lower end of the cylindrical body 23 described later).

Figure 4:
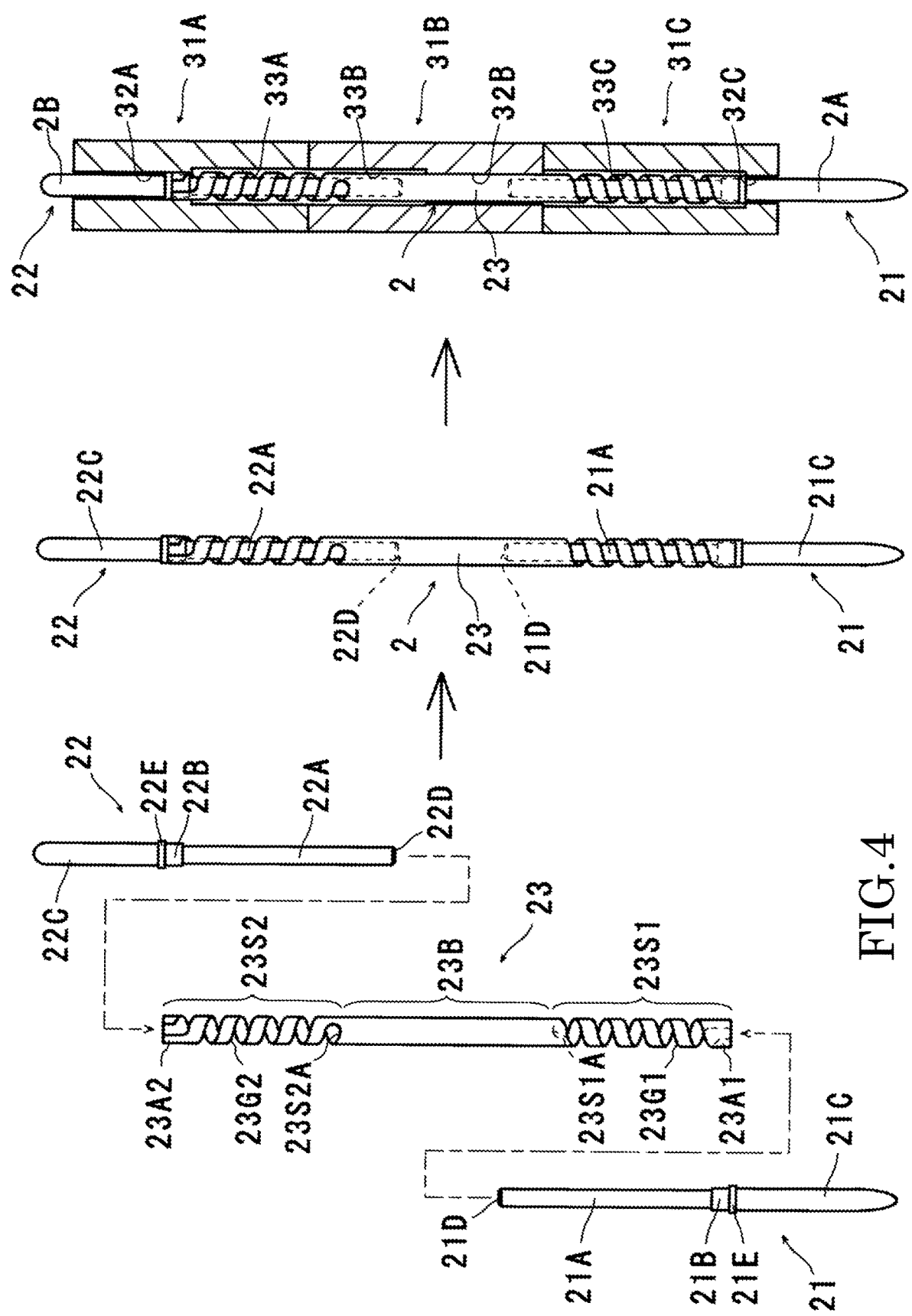
FIG. 4 is a diagram illustrating a procedure for assembling an inspection jig.

When the probe 2 is inserted into the through hole, a first spring portion 23S1 and a second spring portion 23S2 are disposed in the insertion hole portions 33A to 33C as illustrated in FIG. 4. At this time, a gap is formed between the inner peripheral surfaces of the insertion hole portions 33A to 33C and the probe 2. As described above, in the inspection jig 3, the radial distance between the outer peripheral surface of the axial central portion of the first spring portion 23S1 and the second spring portion 23S2 and the support member 31 (the inner peripheral surface of the insertion hole portions 33A to 33C) is configured to be larger than the distance between the body portion 23B and the support portion 32B.

When the probe 2 is supported by the support member 31, the tip end 2A of the probe 2 (specifically, a part of a connection portion 21C in a first central conductor 21 described later) protrudes from the facing surface F1 of the support member 31. Further, the base end 2B of the probe 2 (specifically, a part of a connection portion 22C in a second central conductor 22 described later) slightly protrudes from the rear surface F2 of the support member 31.

The probe 2 inserted and attached to each through hole of the support member 31 includes the first central conductor 21 and the second central conductor 22 made of a conductive material in a bar shape, and the cylindrical body 23 made of a conductive material in a cylindrical shape as illustrated in FIGS. 3 and 4.

FIG. 4 is a diagram illustrating a procedure of assembling the inspection jig 3 from the probe 2 disassembled into the first central conductor 21, the second central conductor 22, and the cylindrical body 23. A nickel or nickel alloy tube having an outer diameter of about 25 to 300 μm and an inner diameter of about 10 to 250 μm, for example, can be used to define the cylindrical body 23. In addition, an inner circumference of the cylindrical body 23 may be coated with a plating layer, such as, for example, a gold plating layer, and the peripheral surface of the cylindrical body 23 may be coated with an insulating coating as necessary.

First and second holding portions 23A1 and 23A2 for holding the first central conductor 21 and the second central conductor 22 are formed at both ends of the cylindrical body 23, as will be described later. Further, the first and second spring portions 23S1 and 23S2 that expand and contract in the axial direction of the cylindrical body 23 are formed over a predetermined length between the holding portions 23A1 and 23A2. In this embodiment, the spring portion formed on the lower side of the cylindrical body 23 illustrated in FIG. 4 is referred to as the first spring portion 23S1, and the spring portion formed on the upper side is referred to as the second spring portion 23S2. In this embodiment, the first spring portion 23S1 and the second spring portion 23S2 are formed to have the same length. Further, the body portion 23B that connects the first and second spring portions 23S1 and 23S2 to each other is formed in a central portion in the length direction of the cylindrical body 23.

Figure 5:
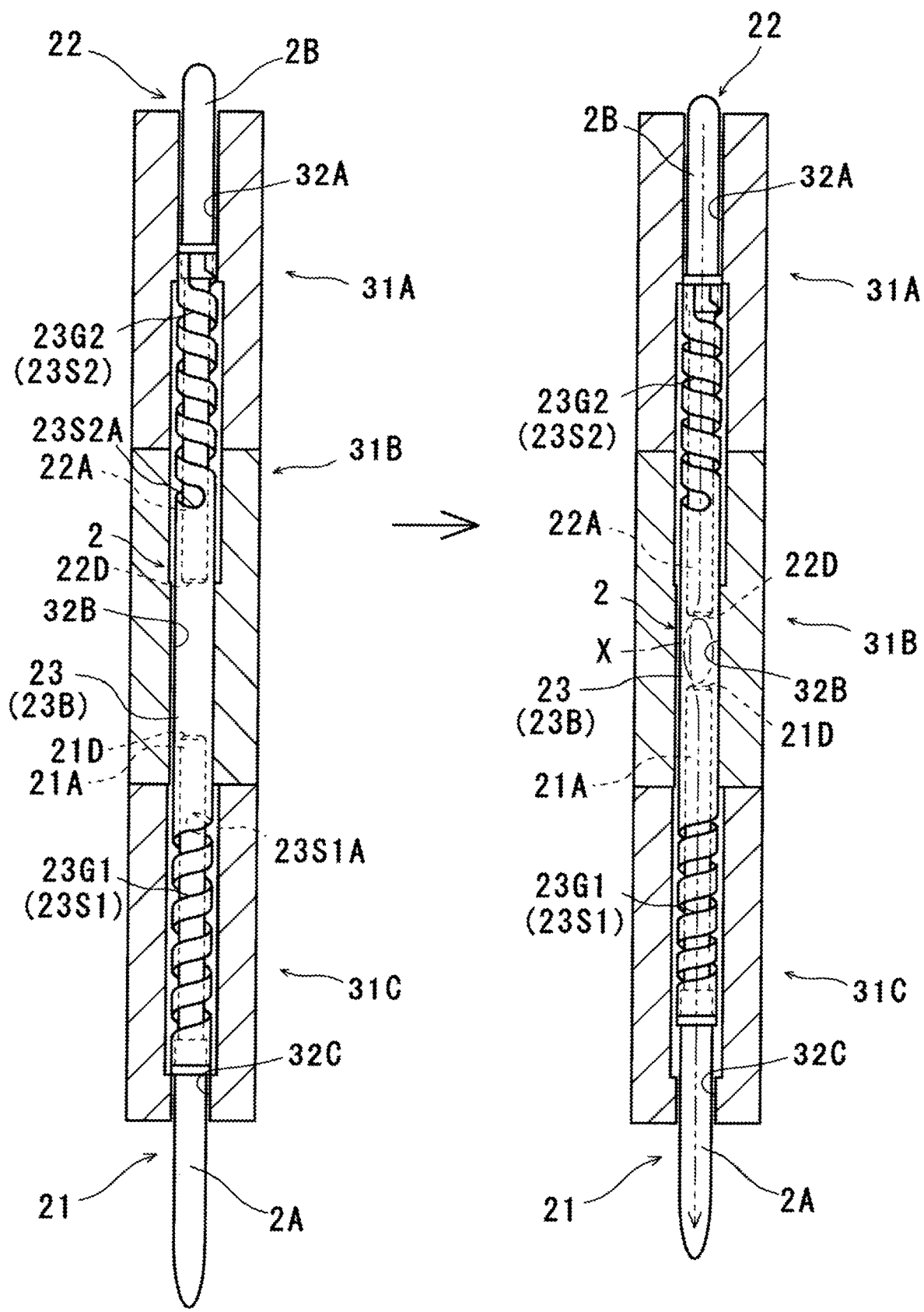
FIG. 5 is a diagram illustrating the inspection jig before and after compression.

The cylindrical body 23 can be formed by, for example, electroforming. The first and second spring portions 23S1 and 23S2 can be formed by using, for example, photolithography. Specifically, from a laser processing machine (not illustrated), the photoresist coated on the peripheral wall of the cylindrical body 23 is irradiated with laser light to be exposed to light, and the photoresist is then developed to form a spiral groove. The cylindrical side surface exposed in the groove is etched to remove the photoresist, so first and second spiral grooves 23G1 and 23G2 are processed, thereby forming a spiral body spirally extending along the peripheral surface of the cylindrical body 23. Then, the first and second spring portions 23S1 and 23S2 are compressed and deformed, so that the cylindrical body 23 can be expanded and contracted in the axial direction as illustrated in FIG. 5.

The body portion 23B is configured by the peripheral wall portion of the cylindrical body 23 that remains in the central portion of the cylindrical body 23 by providing the non-formation portions of the spiral grooves 23G1 and 23G2. The holding portions 23A1 and 23A2 are configured by the peripheral wall of the cylindrical body 23 which is partially divided by a slit extending in substantially parallel with the axial direction of the cylindrical body 23 from the ends of the spiral grooves 23G1 and 23G2 toward the end side of the cylindrical body 23. In this embodiment, the cylindrical body 23 is formed in a symmetrical shape having axes symmetrical to the body portion 23B (central portion of the cylindrical body 23 in the axial direction). As a result, workability when assembling the first central conductor 21 and the second central conductor 22 into the cylindrical body 23 is improved.

As illustrated in FIG. 4, the first central conductor 21 includes a first bar-like main body 21A, a press-fitting portion 21B, a connection portion 21C, an end 21D which is an insertion-side end of the first bar-like main body 21A, and a flange portion 21E. The outer diameter of the first bar-like main body 21A is set to be slightly smaller than the inner diameter of the cylindrical body 23, and the first bar-like main body 21A is inserted into the lower end which is one end of the cylindrical body 23. The end 21D is the upper end surface of the first bar-like main body 21A. The press-fitting portion 21B is provided at the base end of the first bar-like main body 21A and has a larger diameter than the first bar-like main body 21A. The connection portion 21C is continuously provided to the press-fitting portion 21B via the flange portion 21E.

Similarly, the second central conductor 22 includes a second bar-like main body 22A, a press-fitting portion 22B, the connection portion 22C, the end 22D which is the insertion-side end of the second bar-like main body 22A, and a flange portion 22E. The outer diameter of the second bar-like main body 22A is set to be slightly smaller than the inner diameter of the cylindrical body 23, and the second bar-like main body 22A is inserted into the upper end which is the other end of the cylindrical body 23. The end 22D is the lower end surface of the second bar-like main body 22A. The press-fitting portion 22B is provided at the base end of the second bar-like main body 22A and has a larger diameter than the second bar-like main body 22A. The connection portion 22C is continuously provided to the press-fitting portion 22B via the flange portion 22E.

The entire length of the first bar-like main body 21A is set longer than the formation range of the first spring portion 23S1 and the holding portion 23A1 of the cylindrical body 23. Therefore, when the first bar-like main body 21A is inserted into the cylindrical body 23 and the first central conductor 21 is assembled, the end 21D is located on the inner peripheral side of the body portion 23B of the cylindrical body 23. Similarly, the entire length of the second bar-like main body 22A is set longer than the formation range of the second spring portion 23S2 and the holding portion 23A2 of the cylindrical body 23. Therefore, when the second bar-like main body 22A is inserted into the cylindrical body 23 and the second central conductor 22 is assembled, the end 22D is located on the inner peripheral side of the body portion 23B of the cylindrical body 23. In this embodiment, the first bar-like main body 21A and the second bar-like main body 22A are formed to have the same length.

Further, the outer diameters of the first bar-like main body 21A and the second bar-like main body 22A are set to have a minute difference from the inner diameter of the cylindrical body 23. As a result, when performing the later-described inspection with the first central conductor 21 and the second central conductor 22 assembled to the cylindrical body 23, the body portion 23B of the cylindrical body 23, and the first bar-like main body 21A and the second bar-like main body 22A (more specifically, mainly the side surface portion of the end 21D in the first bar-like main body 21A, and the side surface portion of the end 22D in the second bar-like main body 22A) are electrically connected by slidable contact.

The outer diameter of the press-fitting portion 21B of the first bar-like main body 21A is set larger than the inner diameter of the holding portion 23A of the cylindrical body 23 in a state where the first bar-like main body 21A is not inserted into the cylindrical body 23. As a result, when the first bar-like main body 21A is inserted into the cylindrical body 23 and the first central conductor 21 is assembled, the press-fitting portion 21B expands and displaces the holding portion 23A to be press-fitted into the holding portion 23A. Then, while the holding portion 23A is crimped to the peripheral surface of the press-fitting portion 21B, the press-fitting portion 21B is held by the holding portion 23A, so that the first central conductor 21 is kept assembled to the cylindrical body 23. Similarly, with respect to the second central conductor 22, while the holding portion 23A is crimped to the peripheral surface of the press-fitting portion 22B, the press-fitting portion 21B is held by the holding portion 23A, so that the second central conductor 22 is kept assembled to the cylindrical body 23. As a configuration for assembling the first bar-like main body 21A and the second bar-like main body 22A and the cylindrical body 23, welding or caulking can be used in addition to the method of press fitting as described above.

The outer diameters of the flange portions 21E and 22E of the first central conductor 21 and the second central conductor 22 are set larger than the inner diameter of the cylindrical body 23 and larger than the press-fitting portion 21B. With this, when the first bar-like main body 21A and the second bar-like main body 22A are inserted into the cylindrical body 23, the flange portions 21E and 22E contact the end portion of the cylindrical body 23, and the first bar-like main body 21A and the second bar-like main body 22A are located.

Further, a total length of each of the first bar-like main body 21A and the second bar-like main body 22A is set such that a gap is formed between the end 21D and the end 22D as illustrated in FIGS. 4 and 5 in a state that the first central conductor 21 and the second central conductor 22 are assembled to the cylindrical body 23, and an axial load is not applied to the cylindrical body 23.

Furthermore, at the time of semiconductor inspection, a load necessary for the inspection is applied to the cylindrical body 23 in the axial direction thereof, so that the connection portion 21C of the first central conductor 21 and the connection portion 22C of the second central conductor 22 are respectively pushed into the support member 31 (see the right diagram in FIG. 5). At this time, the entire length of the first bar-like main body 21A and the second bar-like main body 22A is set so that the end 21D and the end 22D are maintained in a separated state.

FIG. 5 illustrates the deformation of the probe 2 when a compression load is applied to the probe 2 in the axial direction during the semiconductor inspection. Specifically, the base end 2B of the probe 2 is pressed in the axial direction (downward) by assembling the inspection jig 3 on the first pitch conversion block 35. Further, the tip end 2A of the probe 2 is pressed in the axial direction (upward) by pressing the probe 2 against the semiconductor wafer 100. As a result, the first and second spring portions 23S1 and 23S2 are compressed and the total length of the probe 2 is shortened.

At this time, the base end 2B of the probe 2 and the electrode 352 are held in a stable conductive contact state by a biasing force of the first and second spring portions 23S1 and 23S2 of the cylindrical body 23. Further, the tip end 2A of the probe 2 and the inspection point of the semiconductor wafer 100 are held in a stable conductive contact state.

When conducting a semiconductor inspection in a state where the first and second spring portions 23S1 and 23S2 are compressed in the probe 2, the current flowing from the inspection portion 4 side to the semiconductor wafer 100 side flows as illustrated with by the chained arrow in the right diagram of FIG. 5. That is, the current passes from the second bar-like main body 22A through the cylindrical body 23 (more specifically, the gap X between the central conductors 21 and 22 of the body portion 23B of the cylindrical body 23) and then passes the first bar-like main body 21A. At this time, since the contact resistance increases at the contact portions of the second bar-like main body 22A, the cylindrical body 23, and the first bar-like main body 21A, the amount of Joule heat generated in the gap X of the central conductors 21 and 22 of the body portion 23B becomes large compared to other parts. The current flowing from the semiconductor wafer 100 side to the inspection portion 4 side flows in the direction opposite to the chained arrow in the right diagram of FIG. 5.

Further, the support member 31 in the inspection jig 3 according to this embodiment includes a support portion that supports the cylindrical body 23 by coming into contact with the outer peripheral surface of the body portion 23B of the cylindrical body 23. Specifically, as illustrated in the left diagram of FIG. 5, the support portion 32B formed on the intermediate support body 31B supports the outer peripheral surface of the body portion 23B of the cylindrical body 23.

Then, as illustrated in the right diagram of FIG. 5, when the load necessary for the inspection is applied to the cylindrical body 23 in the axial direction, the end 21D of the first bar-like main body 21A and the end 22D of the second bar-like main body 22A are located on the inner peripheral side of the body portion 23B. Further, at this time, the end 21D of the first bar-like main body 21A is located closer to the other end side (also the lower end side) of the cylindrical body 23 than the one end (the upper end in the right diagram of FIG. 5) of the support portion 32B in the support member 31 which supports the body portion 23B. Similarly, the end 22D of the second bar-like main body 22A is located closer to one end side (also the upper end side) of the cylindrical body 23 than the other end (also the lower end) of the support portion 32B. Further, at this time, the body portion 23B of the cylindrical body 23 is located at the entire portion where the support portion 32B is located.

By configuring the inspection jig 3 according to this embodiment as described above, the Joule heat generated in the gap X between the first central conductor 21 and the second central conductor 22 in the body portion 23B is can be conducted to the support portion 32B in contact with the body portion 23B. That is, according to the inspection jig 3, the Joule heat generated in the gap X can be radiated from the body portion 23B to the support portion 32B before being transferred to the first and second spring portions 23S1 and 23S2. As described above, it is possible to suppress the Joule heat from being conducted to the first and second spring portions 23S1 and 23S2, and to suppress the decrease in the elastic coefficient and the thermal deformation of the first and second spring portions 23S1 and 23S2. Therefore, the inspection accuracy in the inspection device can be maintained.

Further, in the inspection jig 3, a gap is formed between the inner peripheral surfaces of the insertion hole portions 33A to 33C and the probe 2. Therefore, the radial distance between the outer peripheral surface of the axial central portion of the first spring portion 23S1 and the second spring portion 23S2 and the support member 31 (the inner peripheral surfaces of the insertion hole portions 33A to 33C) is configured to be longer than the distance between the body portion 23B and the support portion 32B when the load necessary for the inspection is applied to the cylindrical body 23 in the axial direction.

With the above configuration, when the load necessary for the inspection is applied to the cylindrical body 23 in the axial direction, the support member 31 and the central portion of the first spring portion 23S1 and the second spring portion 23S2 do not come into contact. Therefore, it is possible to suppress the support member 31 from inhibiting the expansion and contraction of the first spring portion 23S1 and the second spring portion 23S2. In addition, as the distance between the first spring portion 23S1 and the second spring portion 23S2 and the inner peripheral surfaces of the insertion hole portions 33A to 33C increases, the inner area of the support member 31 which receives heat radiation from the outer peripheral surfaces of the first spring portion 23S1 and the second spring portion 23S2, and the amount of radiated heat transfer becomes larger. Therefore, it is possible to improve the heat resistance of the inspection jig 3.

In the inspection jig 3 according to this embodiment, the portion located outside the main body 21A when the load necessary for the inspection is applied to the cylindrical body 23 in the axial direction in the first spring portion 23S1 and the body portion 23B is formed to have a resistance value larger than that of the first bar-like main body 21A. Further, in the second spring portion 23S2 and the body portion 23B, the portion located outside the second bar-like main body 22A when the load necessary for the inspection is applied to the cylindrical body 23 in the axial direction thereof, the resistance value is larger than that of the second bar-like main body 22A.

With the configuring as described above, since the current easily flows to the first bar-like main body 21A than the portion of the cylindrical body 23 located outside the first bar-like main body 21A, the Joule heat generated in the first spring portion 23S1 can be suppressed. Similarly, since the current easily flows to the second bar-like main body 22A than the portion of the cylindrical body 23 located outside the second bar-like main body 22A, the Joule heat generated in the second spring portion 23S2 can be suppressed.

Further, in the inspection jig 3 according to this embodiment, the support portion 32B of the intermediate support body 31B is configured to contact the central portion of the body portion 23B when an axial load is applied to the cylindrical body 23 as illustrated in the right diagram of FIG. 5. Accordingly, when an axial load is applied to the cylindrical body 23 during a semiconductor inspection, heat dissipation from the central portion of the body portion 23B where the amount of generated heat is large to the support portion 32B can be promoted. Thereby, the conduction of Joule heat to the first and second spring portions 23S1 and 23S2 can be further suppressed.

Further, in the probe 2 according to this embodiment, the first spring portion 23S1 is formed on the lower end side of the cylindrical body 23, and the second spring portion 23S2 is formed on the upper end side. Then, the body portion 23B is formed between the first spring portion 23S1 and the second spring portion 23S2. As described above, in the probe 2 according to this embodiment, the first and second spring portions 23S1 and 23S2 are disposed avoiding the central portion where the amount of generated heat increases due to the position of the gap X between the first central conductor 21 and the second central conductor 22. As a result, the conduction of Joule heat to the first and second spring portions 23S1 and 23S2 is suppressed.

Further, in the probe 2 according to this embodiment, the cylindrical body 23 is configured by the first spring portion 23S1, the second spring portion 23S2, and the body portion 23B formed between the first spring portion 23S1 and the second spring portion 23S2. As described above, the body portion 23B is disposed in the central portion of the probe 2 where the amount of generated heat is large, so that the conduction of Joule heat to the first and second spring portions 23S1 and 23S2 is suppressed.

Further, in the probe 2 according to this embodiment, the insertion-side (upper side) end of the first bar-like main body 21A and the insertion-side (lower side) end of the second bar-like main body 22A are located on the inner peripheral side of the body portion 23B in a state that no axial load is applied to the cylindrical body 23. Thus, the insertion-side ends of the first bar-like main body 21A and the second bar-like main body 22A are always located on the inner peripheral side of the body portion 23B, so that when a current flows through the probe 2 during the inspection, the Joule heat can be suppressed from being generated in the first and second spring portions 23S1 and 23S2.

Further, in the probe 2 according to this embodiment, the first spring portion 23S1 and the second spring portion 23S2 are formed to have the same length. Further, the first bar-like main body 21A and the second bar-like main body 22A are formed to have the same length. As a result, the distance from the gap X between the first central conductor 21 and the second central conductor 22 in the cylindrical body 23 to the first and second spring portions 23S1 and 23S2 becomes equal. Therefore, it is possible to equalize the influence of the conduction of the Joule heat on the first spring portion 23S1 and the second spring portion 23S2.

Figure 6:
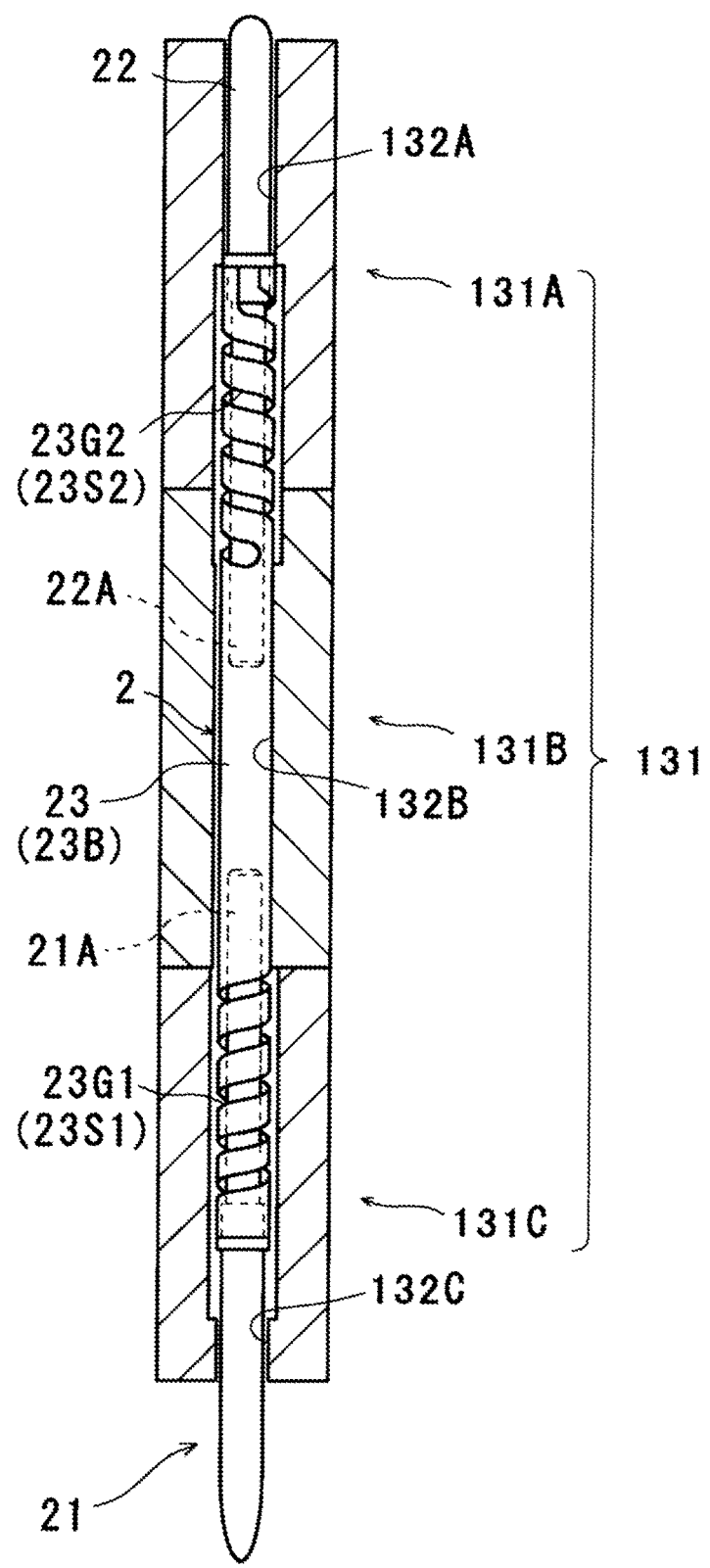
FIG. 6 is a cross-sectional view schematically illustrating a configuration of an inspection jig according to a modification of the first embodiment.

Next, an inspection jig according to a modification of the first embodiment will be described with reference to FIG. 6. The inspection jig in this modification is different from the inspection jig 3 in the above embodiment only in the shape of a support member 131 that supports the probe 2. For this reason, in this modification, the support member 131 different from the above-described embodiment will be mainly described, and detailed description of other configurations will be omitted.

The support member 131 in this modification is configured by an electrode-side support body 131A, an intermediate support body 131B, and an inspection-side support body 131C which are each formed in a disk shape having the same diameter. Hereinafter, the electrode-side support body 131A, the intermediate support body 131B, and the inspection-side support body 131C are simply referred to as "support bodies 131A to 131C". The support bodies 131A to 131C are configured in the same manner as the support bodies 31A to 31C in the embodiment.

Each of the support bodies 131A to 131C is formed with an insertion hole formed of an opening hole having a predetermined diameter and an opening hole formed of support portions 132A to 132C having a diameter smaller than that of the insertion hole. Here, in this modification, the support portion 132B formed on the intermediate support body 131B is formed longer than the other support portions 132A and 132C. Then, in the support bodies 131A to 131C, the support portions 132A to 132C and the insertion hole portions are communicated with each other, thereby forming a through hole into which the probe 2 is inserted.

The inspection jig is configured by inserting the probe 2 into the through holes (support portions 132A to 132C and insertion hole portions) formed in the support bodies 131A to 131C. At this time, the support portion 132B contacts the outer peripheral surface of the body portion 23B in the cylindrical body 23 of the probe 2. More specifically, as illustrated in FIG. 6, the support portion 132B is formed on the entire portion of the probe 2 where the body portion 23B is located when an axial load is applied to the cylindrical body 23 during a semiconductor inspection.

With this configuration in this modification, it is possible to promote heat dissipation from the entire body portion 23B to the support portion 132B in a state where an axial load is applied to the cylindrical body 23 during a semiconductor inspection. Therefore, the conduction of Joule heat to the first and second spring portions 23S1 and 23S2 can be further suppressed.

Next, a probe 102 which is a contact terminal according to another embodiment will be described with reference to FIG. 7. Also in this embodiment, a description will be given focusing on a portion different from the probe 2 according to the first embodiment, and detailed description of other configurations will be omitted.

Figure 7:
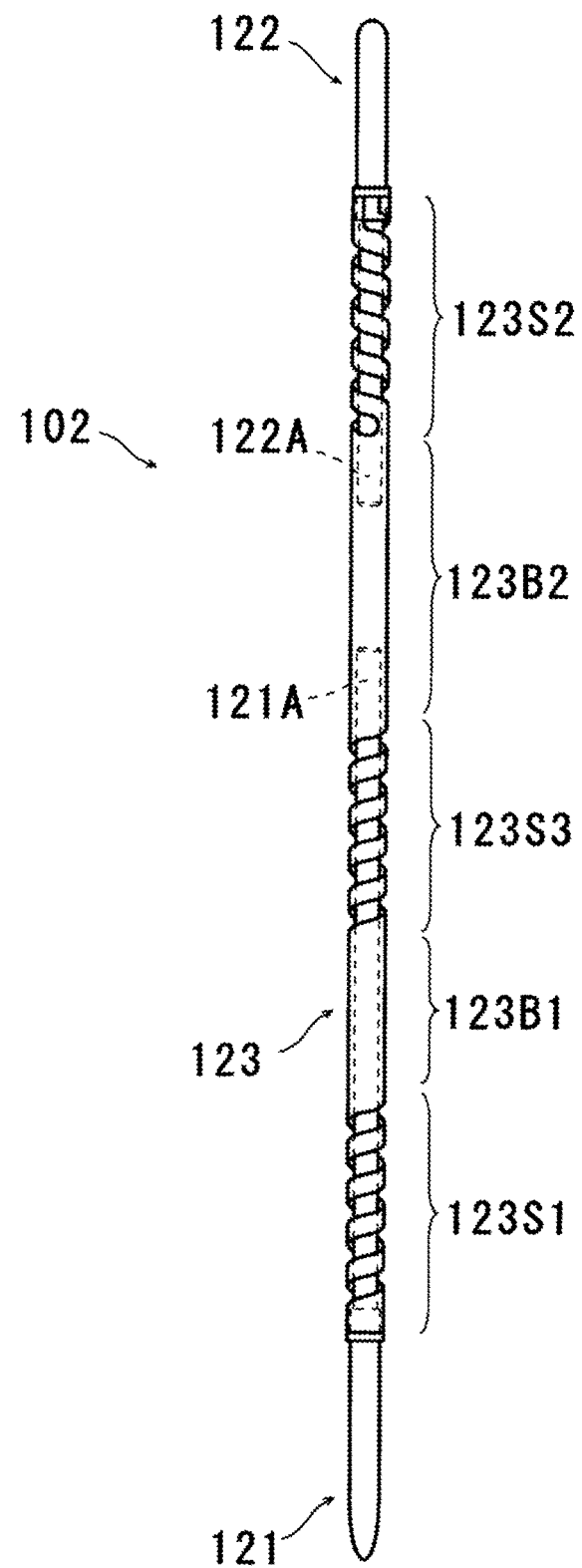
FIG. 7 is a diagram illustrating a configuration of a contact terminal according to another mode.

As illustrated in FIG. 7, the probe 102 according to this embodiment includes a first central conductor 121 and a second central conductor 122 made of a conductive material in a bar shape, and a cylindrical body 123 made of a conductive material in a cylindrical shape.

The cylindrical body 123 is formed with a first spring portion 123S1 on the lower side, a second spring portion 123S2 on the upper side, and a third spring portion 123S3 between the first spring portion 123S1 and the second spring portion 123S2. Further, the cylindrical body 123 is formed with a first body portion 123B1 that connects the first spring portion 123S1 and the third spring portion 123S3 to each other, and a second body portion 123B2 that connects the second spring portion 123S2 and the third spring portion 123S3 to each other. In other words, the cylindrical body 123 in the probe 102 is configured by the first spring portion 123S1, the second spring portion 123S2, the first body portion 123B1 and the second body portion 123B2 formed between the first spring portion 123S1 and the third spring portion 123S3, and the third spring portion 123S3 formed between the first body portion 123B1 and the second body portion 123B2.

As illustrated in FIG. 7, the first central conductor 121 includes a first bar-like main body 121A, and the second central conductor 122 includes a second bar-like main body 122A. The first bar-like main body 121A is inserted into the lower end of the cylindrical body 123. The second bar-like main body 122A is inserted into the upper end of the cylindrical body 123.

In this embodiment, the first bar-like main body 121A is formed to have a length from the lower end of the cylindrical body 123 to the second body portion 123B2. Therefore, when the first bar-like main body 121A is inserted into the cylindrical body 123 and the first central conductor 121 is assembled, the upper end of the first bar-like main body 121A is located on the inner peripheral side of the second body portion 123B2 of the cylindrical body 123. On the other hand, the second bar-like main body 122A is formed to have a length from the upper end of the cylindrical body 123 to the second body portion 123B2. Therefore, when the second bar-like main body 122A is inserted into the cylindrical body 123 and the second central conductor 122 is assembled, the lower end of the second bar-like main body 122A is located on the inner peripheral side of the second body portion 123B2 of the cylindrical body 123.

According to the probe 102 of this embodiment, it is easy to stabilize the shape of the cylindrical body 123 when the cylindrical body 123 is compressed by providing the first body portion 123B1. Further, as compared with the case where the second spring portion 123S2 and the third spring portion 123S3 are continuously provided, the first body portion 123B1 radiates the Joule heat to the outside, so that the decreases of an elastic coefficient due to heat and thermal deformation are easily suppressed. The number of body portions is not limited to two, and three or more body portions may be provided.

Figure 8:
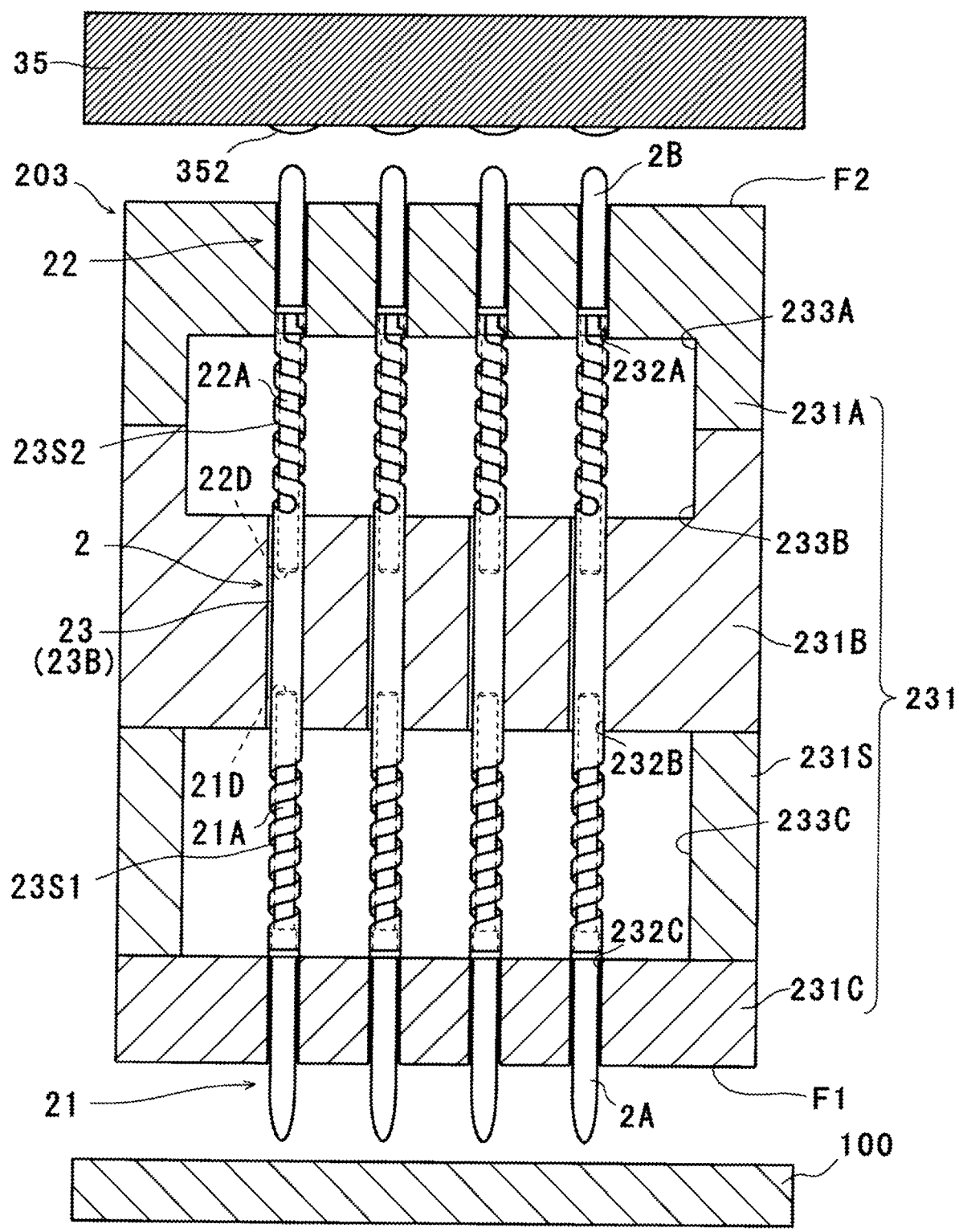
FIG. 8 is a cross-sectional view schematically illustrating an example of a configuration of an inspection jig according to a second embodiment.

Next, an inspection jig 203 according to the second embodiment of the present disclosure will be described with reference to FIGS. 8 and 9. FIG. 8 illustrates the state of the inspection jig 203 before the inspection, and FIG. 9 illustrates the state of the inspection jig 203 during the inspection (the state in which the load necessary for the inspection is applied to the cylindrical body 23 in its axial direction).

The inspection jig 203 in this embodiment is different from the inspection jig 3 in the first embodiment only in the shape of a support member 231 that supports the probe 2. For this reason, in this embodiment, the support member 231 different from the first embodiment will be mainly described, and detailed description of other configurations such as the probe 2 will be omitted.

Figure 9:
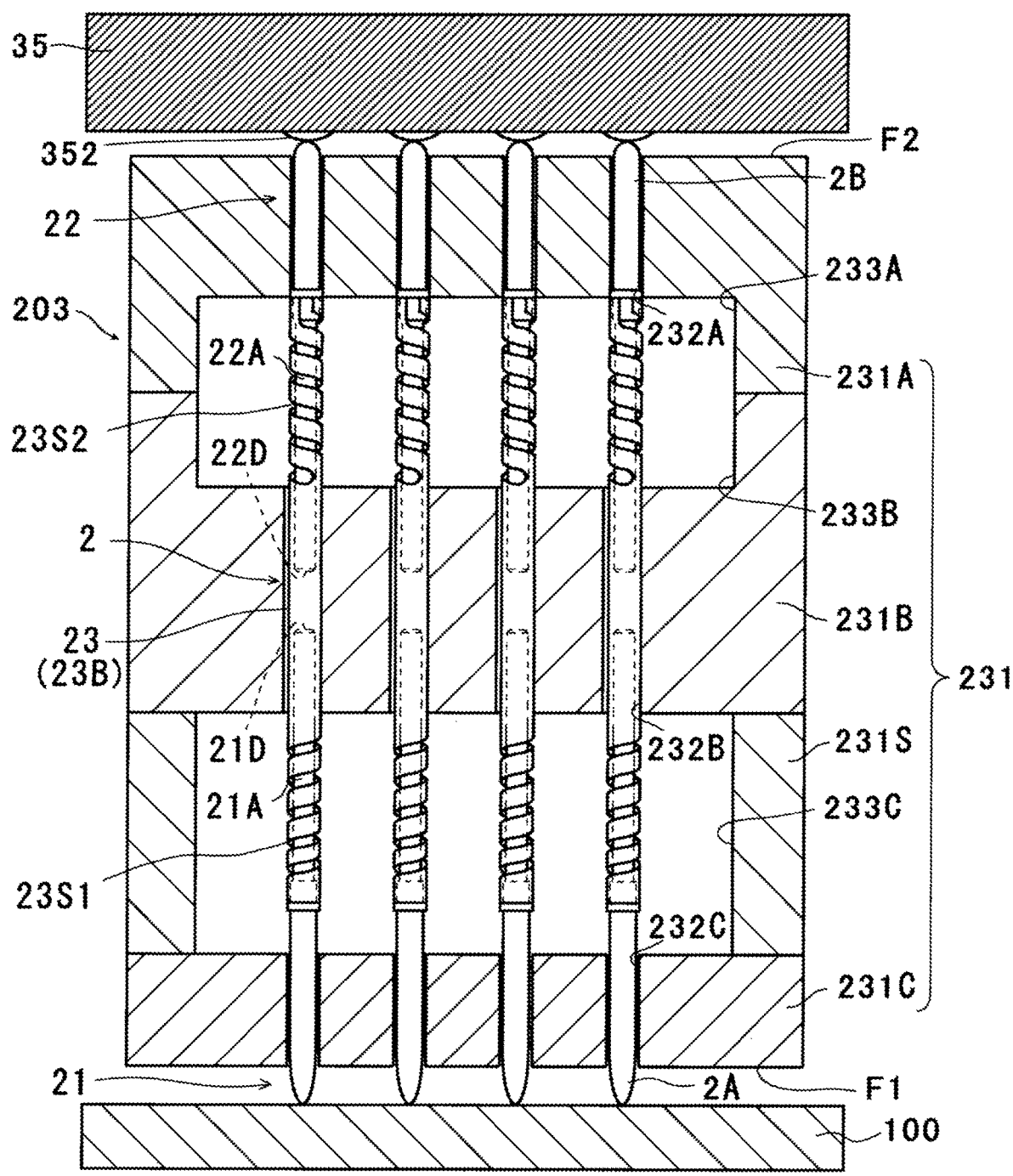
FIG. 9 is a cross-sectional view schematically illustrating a configuration of the inspection jig at the time of inspection according to the second embodiment.

As illustrated in FIGS. 8 and 9, the support member 231 in this embodiment includes an electrode-side support body 231A, an intermediate support body 231B, a spacer 231S, and an inspection-side support body 231C. Hereinafter, the electrode-side support body 231A, the intermediate support body 231B, and the inspection-side support body 231C are simply referred to as "support bodies 231A to 231C". The electrode-side support body 231A, the intermediate support body 231B, the spacer 231S, and the inspection-side support body 231C are sequentially stacked from the first pitch conversion block 35 side. That is, the inspection-side support body 231C is arranged so as to face the semiconductor wafer 100. The same materials as those of the inspection jig 3 according to the first embodiment are adopted as the materials of the support bodies 231A to 231C and the spacer 231S.

As illustrated in FIG. 8, the support bodies 231A to 231C are formed with opening holes made of support portions 232A to 232C, respectively, into which the probe 2 is inserted. Further, in the electrode-side support body 231A, the intermediate support body 231B, and the spacer 231S, hollow portions 233A, 233B, and 233C are formed as spaces for accommodating the first spring portion 23S1 and the second spring portion 23S2.

Then, the probe 2 is inserted into the support portions 232A to 232C and the hollow portions 233A to 233C formed on the support bodies 231A to 231C, and the spacer 231S, so that the inspection jig 203 is configured. At this time, the support portions 232A to 232C are in contact with the outer peripheral surface of the probe 2, so that the probe 202 is supported by the support member 231.

Further, the support member 231 in the inspection jig 203 according to this embodiment includes a support portion that supports the cylindrical body 23 by coming into contact with the outer peripheral surface of the body portion 23B of the cylindrical body 23. Specifically, as illustrated in FIG. 8, the support portion 232B formed on the intermediate support body 231B supports the outer peripheral surface of the body portion 23B of the cylindrical body 23.

Then, as illustrated in FIG. 9, when the load necessary for the inspection is applied to the cylindrical body 23 in the axial direction, the end 21D of the first bar-like main body 21A and the end 22D of the second bar-like main body 22A are located on the inner peripheral side of the body portion 23B. Further, at this time, the end 21D of the first bar-like main body 21A is located closer to the other end side (also the lower end side) of the cylindrical body 23 than the one end (the upper end in FIG. 8) of the support portion 232B in the support member 231 which supports the body portion 23B. Similarly, the end 22D of the second bar-like main body 22A is located closer to one end side (also the upper end side) of the cylindrical body 23 than the other end (also the lower end) of the support portion 232B. Further, at this time, the body portion 23B of the cylindrical body 23 is located at all of the portions where the support portion 232B is located.

By configuring the inspection jig 203 according to this embodiment as described above, the Joule heat generated in the gap between the first central conductor 21 and the second central conductor 22 in the body portion 23B is can be conducted to the support portion 232B in contact with the body portion 23B. That is, according to the inspection jig 203, the Joule heat generated in the gap can be radiated from the body portion 23B to the support portion 232B before being transferred to the first and second spring portions 23S1 and 23S2. As described above, it is possible to suppress the Joule heat from being conducted to the first and second spring portions 23S1 and 23S2, and to suppress the decrease in the elastic coefficient and the thermal deformation of the first and second spring portions 23S1 and 23S2. Therefore, the inspection accuracy in the inspection device can be maintained.

Further, in the inspection jig 203, when a load necessary for the inspection is applied to the cylindrical body 23 in the axial direction, the first spring portion 23S1 and the second spring portion 23S2 are stored in the hollow portions 233A, 233B, and 233C. Therefore, the radial distance between the outer peripheral surface of the axial central portion of the first spring portion 23S1 and the second spring portion 23S2 and the support member 231 (the inner peripheral surface of the hollow portions 233A, 233B, and 233C) is configured to be larger than the distance between the body portion 23B and the support portion 232B.

With the above configuration, when the load necessary for the inspection is applied to the cylindrical body 23 in the axial direction, the support member 231 and the central portion of the first spring portion 23S1 and the second spring portion 23S2 do not come into contact. Therefore, it is possible to suppress the support member 231 from inhibiting the expansion and contraction of the first spring portion 23S1 and the second spring portion 23S2. In addition, as the distance between the first spring portion 23S1 and the second spring portion 23S2 and the inner peripheral surfaces of the hollow portions 233A, 233B, and 233C increases, the inner area of the support member 231 which receives heat radiation from the outer peripheral surfaces of the first spring portion 23S1 and the second spring portion 23S2, and the amount of radiated heat transfer becomes larger. Therefore, it is possible to improve the heat resistance of the inspection jig 203.

As described above, an inspection jig according to an example of the present disclosure includes a contact terminal, and a support member that supports the contact terminal. The contact terminal includes a cylindrical body formed of a conductive material in a cylindrical shape, and a first central conductor and a second central conductor formed of a conductive material in a bar shape. The first central conductor includes a first bar-like main body that is inserted into one end of the cylindrical body. The second central conductor includes a second bar-like main body that is inserted into another end of the cylindrical body. The cylindrical body includes a spring portion formed of a spiral body that is configured by providing a spiral groove along a peripheral surface of the cylindrical body, and a body portion where the spiral groove is not provided. A first spring portion is formed in one end side of the cylindrical body, a second spring portion is formed on the other side, and the body portion is formed between the first spring portion and the second spring portion. An outer peripheral surface of the cylindrical body is supported by a support portion in the support member. When a load necessary for inspection is applied to the cylindrical body in an axial direction, an insertion-side end of the first bar-like main body and an insertion-side end of the second bar-like main body are located on an inner peripheral side of the body portion, the insertion-side end of the first bar-like main body is located closer to the other end side of the cylindrical body than one end of the support portion in the support member that supports the body portion, the insertion-side end of the second bar-like main body is located closer to one end side of the cylindrical body than the other end of the support portion, and the body portion is located in an entire portion where the support portion is located. A radial distance between an outer peripheral surface of an axial central portion of at least one of the first spring portion and the second spring portion and the support member is larger than a distance between the body portion and the support portion.

According to this configuration, it is possible to suppress the conduction of Joule heat generated in the gap between the central conductors of the cylindrical body to the spring portion. Therefore, the inspection accuracy in the inspection device can be maintained by suppressing the decrease in the elastic coefficient and the thermal deformation of the spring portion. Further, when the load necessary for the inspection is applied to the cylindrical body 23 in the axial direction thereof, the support member does not come into contact with the central portion of the first and second spring portions, so that it is possible to suppress that the support member inhibits expansion and contraction. In addition, as the distance between the spring portion and the support member increases, the inner area of the support member which receives heat radiation from the outer peripheral surfaces of the spring portion becomes larger. Therefore, it is possible to improve the heat resistance of the inspection jig.

Further, when a load necessary for the inspection is applied to the cylindrical body in its axial direction, it is preferable that the support portion of the support member is formed on all of the portions where the body portion is located.

According to this configuration, it is possible to promote heat dissipation from the entire support portions of the body portion to the support portion, so that it is possible to further suppress the conduction of Joule heat to the first and second spring portions.

In addition, it is preferable that the cylindrical body includes the first spring portion, the second spring portion, a plurality of body portions formed between the first spring portion and the second spring portion, and another spring portion formed between the plurality of body portions.

According to this configuration, since the plurality of body portions are formed between the spring portions, it is possible to stabilize the shape of the cylindrical body when the cylindrical body is compressed.

Further, the insertion-side end of the first bar-like main body and the insertion-side end of the second bar-like main body are preferably located on the inner peripheral side of the body portion in the state where no axial load is applied to the cylindrical body.

According to this configuration, the insertion-side ends of the first bar-like main body and the second bar-like main body are always located on the inner peripheral side of the body portion, so that when a current flows through the contact terminal during the inspection, the Joule heat can be suppressed from being generated in the first and second spring portions.

Further, it is preferable that the first spring portion and the second spring portion have the same length, and the first bar-like main body and the second bar-like main body have the same length.

According to this configuration, the distance from the gap between the first central conductor and the second central conductor in the cylindrical body to the first and second spring portions becomes equal. Therefore, it is possible to equalize the influence of the conduction of the Joule heat on the first spring portion and the second spring portion.

Moreover, it is preferable that the cylindrical body is formed in a symmetrical shape having a symmetrical axis at a central portion in the axial direction.

According to this configuration, workability when assembling the first central conductor and the second central conductor into the cylindrical body can be improved.

Further, the inspection device according to an example of the present disclosure includes any inspection jig and an inspection processing unit that inspects the inspection object based on an electrical signal obtained by bringing the contact terminal into contact with an inspection point provided in the inspection object.

According to this configuration, it is possible to suppress the conduction of Joule heat generated in the gap between the central conductors of the cylindrical body to the spring portion. Therefore, the inspection accuracy in the inspection device can be maintained by suppressing the decrease in the elastic coefficient and the thermal deformation of the spring portion.

A contact terminal according to an example of the present disclosure is supported by a support member of an inspection jig. The contact terminal includes a cylindrical body formed of a conductive material in a cylindrical shape, and a support member that supports the contact terminal. The contact terminal includes a cylindrical body formed of a conductive material in a cylindrical shape, and a first central conductor and a second central conductor formed of a conductive material in a bar shape. The first central conductor includes a first bar-like main body that is inserted into one end of the cylindrical body. The second central conductor includes a second bar-like main body that is inserted into another end of the cylindrical body. The cylindrical body includes a spring portion formed of a spiral body that is configured by providing a spiral groove along a peripheral surface of the cylindrical body, and a body portion where the spiral groove is not provided. A first spring portion is formed in one end side of the cylindrical body, a second spring portion is formed on the other side, and the body portion is formed between the first spring portion and the second spring portion. An outer peripheral surface of the cylindrical body is supported by a support portion in the support member. When a load necessary for inspection is applied to the cylindrical body in an axial direction, an insertion-side end of the first bar-like main body and an insertion-side end of the second bar-like main body are located on an inner peripheral side of the body portion, the insertion-side end of the first bar-like main body is located closer to the other end side of the cylindrical body than one end of the support portion in the support member that supports the body portion, the insertion-side end of the second bar-like main body is located closer to one end side of the cylindrical body than the other end of the support portion, and the body portion is located in an entire portion where the support portion is located. A radial distance between an outer peripheral surface of an axial central portion of at least one of the first spring portion and the second spring portion and the support member is larger than a distance between the body portion and the support portion.

According to this configuration, it is possible to suppress the conduction of Joule heat generated in the gap between the central conductors of the cylindrical body to the spring portion. Therefore, the inspection accuracy in the inspection device can be maintained by suppressing the decrease in the elastic coefficient and the thermal deformation of the spring portion.

This application is based on Japanese Patent Application No. 2018-156097 filed on Aug. 23, 2018, the content of which is included in the present application. It should be noted that the specific embodiments or examples made in the modes for carrying out the present disclosure are merely for clarifying the technical contents of the present disclosure, and the present disclosure is not limited only to such specific examples. It should not be construed in a narrow sense by limiting only.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig, comprising:
    a contact terminal; and
    a support member that supports the contact terminal,
    wherein the contact terminal includes a cylindrical body formed of a conductive material in a cylindrical shape, and a first central conductor and a second central conductor formed of a conductive material in a bar shape,
    the first central conductor includes a first bar-like main body that is inserted into one end of the cylindrical body,
    the second central conductor includes a second bar-like main body that is inserted into another end of the cylindrical body,
    the cylindrical body includes a spring portion formed of a spiral body that is configured by providing a spiral groove along a peripheral surface of the cylindrical body, and a body portion where the spiral groove is not provided,
    a first spring portion is formed in one end side of the cylindrical body, a second spring portion is formed on the other side, and the body portion is formed between the first spring portion and the second spring portion,
    an outer peripheral surface of the body portion is supported by a support portion in the support member,
    when a load necessary for inspection is applied to the cylindrical body in an axial direction, an insertion-side end of the first bar-like main body and an insertion-side end of the second bar-like main body are located on an inner peripheral side of the body portion, the insertion-side end of the first bar-like main body is located closer to the other end side of the cylindrical body than one end of the support portion in the support member that supports the body portion, the insertion-side end of the second bar-like main body is located closer to one end side of the cylindrical body than the other end of the support portion, and the body portion is located in an entire portion where the support portion is located, and
    a radial distance between an outer peripheral surface of an axial central portion of at least one of the first spring portion and the second spring portion and the support member is larger than a distance between the body portion and the support portion.

2. The inspection jig according to claim 1, wherein the load necessary for inspection is applied to the cylindrical body in the axial direction, the support portion in the support member is formed in an entire portion where the body portion is located.

3. The inspection jig according to claim 1, wherein the cylindrical body includes the first spring portion, the second spring portion, a plurality of the body portions formed between the first spring portion and the second spring portion, and another spring portion formed between the plurality of the body portions.

4. The inspection jig according to claim 1, wherein the insertion-side end of the first bar-like main body and the insertion-side end of the second bar-like main body are located on an inner peripheral side of the body portion in a state where an axial load is not applied to the cylindrical body.

5. The inspection jig according to claim 1, wherein
the first spring portion and the second spring portion have the same length, and
the first bar-like main body and the second bar-like main body have the same length.

6. The inspection jig according to claim 1, wherein the cylindrical body is formed in a symmetrical shape having a symmetrical axis at a central portion in an axial direction.

7. An inspection device, comprising:
the inspection jig according to claim 1; and
an inspection processing unit that inspects an inspection object based on an electrical signal obtained by bringing the contact terminal into contact with an inspection point provided in the inspection object.

8. A contact terminal for supporting by a support member of an inspection jig, comprising:
a cylindrical body formed of a conductive material in a cylindrical shape; and
a first central conductor and a second central conductor formed of a conductive material in a bar shape,
the first central conductor includes a first bar-like main body that is inserted into one end of the cylindrical body,
the second central conductor includes a second bar-like main body that is inserted into another end of the cylindrical body,
the cylindrical body includes a spring portion formed of a spiral body that is configured by providing a spiral groove along a peripheral surface of the cylindrical body, and a body portion where the spiral groove is not provided,
a first spring portion is formed in one end side of the cylindrical body, a second spring portion is formed on the other side, and the body portion is formed between the first spring portion and the second spring portion,
an outer peripheral surface of the body portion is supported by a support portion in the support member,
when a load necessary for inspection is applied to the cylindrical body in an axial direction, an insertion-side end of the first bar-like main body and an insertion-side end of the second bar-like main body are located on an inner peripheral side of the body portion, the insertion-side end of the first bar-like main body is located closer to the other end side of the cylindrical body than one end of the support portion in the support member that supports the body portion, the insertion-side end of the second bar-like main body is located closer to one end side of the cylindrical body than the other end of the support portion, and the body portion is located in an entire portion where the support portion is located, and
a radial distance between an outer peripheral surface of an axial central portion of at least one of the first spring portion and the second spring portion and the support member is larger than a distance between the body portion and the support portion.

9. The inspection jig according to claim 2, wherein the cylindrical body includes the first spring portion, the second spring portion, a plurality of the body portions formed between the first spring portion and the second spring portion, and another spring portion formed between the plurality of the body portions.

10. The inspection jig according to claim 2, wherein the insertion-side end of the first bar-like main body and the insertion-side end of the second bar-like main body are located on an inner peripheral side of the body portion in a state where an axial load is not applied to the cylindrical body.

11. The inspection jig according to claim 2, wherein
the first spring portion and the second spring portion have the same length, and
the first bar-like main body and the second bar-like main body have the same length.

12. The inspection jig according to claim 2, wherein the cylindrical body is formed in a symmetrical shape having a symmetrical axis at a central portion in an axial direction.

13. An inspection device, comprising:
the inspection jig according to claim 2; and
an inspection processing unit that inspects an inspection object based on an electrical signal obtained by bringing the contact terminal into contact with an inspection point provided in the inspection object.

14. The inspection jig according to claim 3, wherein the insertion-side end of the first bar-like main body and the insertion-side end of the second bar-like main body are located on an inner peripheral side of the body portion in a state where an axial load is not applied to the cylindrical body.

15. The inspection jig according to claim 3, wherein
the first spring portion and the second spring portion have the same length, and
the first bar-like main body and the second bar-like main body have the same length.

16. The inspection jig according to claim 3, wherein the cylindrical body is formed in a symmetrical shape having a symmetrical axis at a central portion in an axial direction.

17. An inspection device, comprising:
the inspection jig according to claim 3; and
an inspection processing unit that inspects an inspection object based on an electrical signal obtained by bringing the contact terminal into contact with an inspection point provided in the inspection object.

18. The inspection jig according to claim 4, wherein
the first spring portion and the second spring portion have the same length, and
the first bar-like main body and the second bar-like main body have the same length.

19. The inspection jig according to claim 4, wherein the cylindrical body is formed in a symmetrical shape having a symmetrical axis at a central portion in an axial direction.

20. An inspection device, comprising:
the inspection jig according to claim 4; and
an inspection processing unit that inspects an inspection object based on an electrical signal obtained by bringing the contact terminal into contact with an inspection point provided in the inspection object.

21. The inspection jig of claim 1, further comprising:
a first and a second holding portions,
wherein the first holding portion is located at one end of the cylindrical body and includes a slit that extends substantially parallel with an axial direction of the cylindrical body from the one end of the cylindrical body to the spiral groove of the first spring portion, wherein the second first holding portion is located at the other one end of the cylindrical body and includes a slit that extends substantially parallel with an axial direction of the cylindrical body from the other end of the cylindrical body to the spiral groove of the second spring portion.

\* \* \* \* \*